(12) United States Patent
Jagannathan et al.

(10) Patent No.: US 10,734,974 B1
(45) Date of Patent: Aug. 4, 2020

(54) TRANSMITTER CIRCUIT HAVING A PRE-EMPHASIS DRIVER CIRCUIT

(71) Applicant: NXP USA, INC., Austin, TX (US)

(72) Inventors: Srikanth Jagannathan, Austin, TX (US); Kumar Abhishek, Bee Cave, TX (US)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 16/382,538

(22) Filed: Apr. 12, 2019

(51) Int. Cl.
  H04L 27/00 (2006.01)
  H03K 3/012 (2006.01)
  H04B 1/04 (2006.01)
  H03K 17/687 (2006.01)

(52) U.S. Cl.
  CPC ........... *H03K 3/012* (2013.01); *H03K 17/687* (2013.01); *H04B 1/04* (2013.01)

(58) Field of Classification Search
  CPC ..... H04L 1/003; H04L 1/0071; H04L 5/0007; G06F 13/1673; G06F 13/4068; H03K 19/0005; H03K 5/1534
  USPC .......................... 375/295, 219; 327/108, 109
  See application file for complete search history.

(56) References Cited

U.S. PATENT DOCUMENTS

| | | | |
|---|---|---|---|
| 6,977,534 B2 | 12/2005 | Radelinow | |
| 7,196,557 B1 | 3/2007 | Kwasniewski et al. | |
| 7,352,211 B1 | 4/2008 | De Araujo et al. | |
| 8,155,180 B2 | 4/2012 | Wong et al. | |
| 8,415,986 B2 | 4/2013 | Seth et al. | |
| 2005/0070229 A1 | 3/2005 | Casper et al. | |
| 2007/0104111 A1 | 5/2007 | Kakizawa | |
| 2009/0015312 A1* | 1/2009 | Kuwahara | G11C 7/04 327/330 |
| 2010/0176815 A1* | 7/2010 | Roth | G01R 31/31905 324/533 |
| 2010/0301905 A1 | 12/2010 | Kanda | |
| 2011/0163791 A1* | 7/2011 | Kanda | H03K 19/01721 327/315 |
| 2012/0194224 A1* | 8/2012 | Moon | H03K 5/1515 327/99 |
| 2013/0033290 A1* | 2/2013 | King | H04L 25/0286 327/108 |
| 2017/0047914 A1* | 2/2017 | Hosokawa | H01L 28/40 |

FOREIGN PATENT DOCUMENTS

EP  2387187 A3  12/2011

* cited by examiner

*Primary Examiner* — Khai Tran (57) ABSTRACT

A circuit includes a transmitter circuit which includes a single-to-complementary circuit, a driver stage, and a pre-emphasis control circuit. The single-to-complementary circuit generates complementary output signals from a single ended input signal. The driver stage includes inputs to receive the complementary output signals, the driver stage includes a main driver circuit and a pre-emphasis driver circuit, and the pre-emphasis driver circuit is active during transitions of the complementary output signals to provide additional current for the driver stage. The pre-emphasis control circuit includes an RC pulse generation circuit in which the RC pulse generation circuit includes a capacitance and a resistance, and the RC pulse generation circuit provides, based on edges of a signal, pulses having a duration based on an RC time constant of the capacitance and resistance. The pre-emphasis driver circuit is active to provide additional current for the driver stage in response to the pulses.

19 Claims, 3 Drawing Sheets

TRANSMITTER CIRCUIT HAVING A PRE-EMPHASIS DRIVER CIRCUIT

BACKGROUND

Field

This disclosure relates generally to integrated circuits, and more specifically, to a transmitter circuit having a pre-emphasis driver circuit.

Related Art

LVDS is a technical standard that specifies electrical characteristics of a differential, serial communications protocol. LVDS typically operates at low power and can run at very high speeds, such as 5 Gbps. In an LVDS transmission system, differential signals are provided via a pair of transmission lines to a load in which the pair of lines carry complementary signals.

In an LVDS transmission, though, if the driver is weak, the transmitter design is susceptible to reflections. This is generally not a problem when the signal is transmitted out from the die as the signal gets cleaned up as it transfers to the package side. However, on the die side, the reflected signal is messy, including malfunctions or glitches. This may be due, for example, to impedance mismatch between the pad design on the die and the package. These reflections become problematic for loopback testing in which the transmitted signals provided to the die pads are converted to a single ended signal and provided back to the die or System on a Chip (SOC) for testing, such as by a built-in self-test (BIST) circuit.

In some solutions available today, pre-emphasis P-type metal-oxide-semiconductor (PMOS) transistors and N-type metal-oxide-semiconductor (NMOS) transistors are turned on during data transitions provided to the LVDS transmitter. These transistors generate a pulse of additional drive current applied to the transmitter to avoid reflections. However, the transistors generating the variable pulse width are sensitive to power-voltage-temperature (PVT) corners and consume too much current. Therefore, a need exists for an improved pre-emphases circuit with more reliable control and lower current consumption.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

In one aspect, a pre-emphasis driver circuit in addition to a main driver circuit is used in a driver stage of an LVDS transmitter. The pre-emphasis driver circuit is active during transitions of the input signals to the driver stage to provide additional current for the driver stage. A pre-emphasis control circuit includes a resistor-capacitor (RC) circuit which provides RC pulses to the pre-emphasis driver circuit to activate the pre-emphasis driver circuit in which the duration of the RC pulses is based on an RC time constant of the RC circuit. In this manner, the pulse widths provided to the main driver circuit need not be changed or made variable. Furthermore, by controlling the duration of the RC pulses to the pre-emphasis driver circuit with an RC time constant rather than through the use of transistors, reduced delay variation and reduced current consumption may be achieved.

Figure 1:
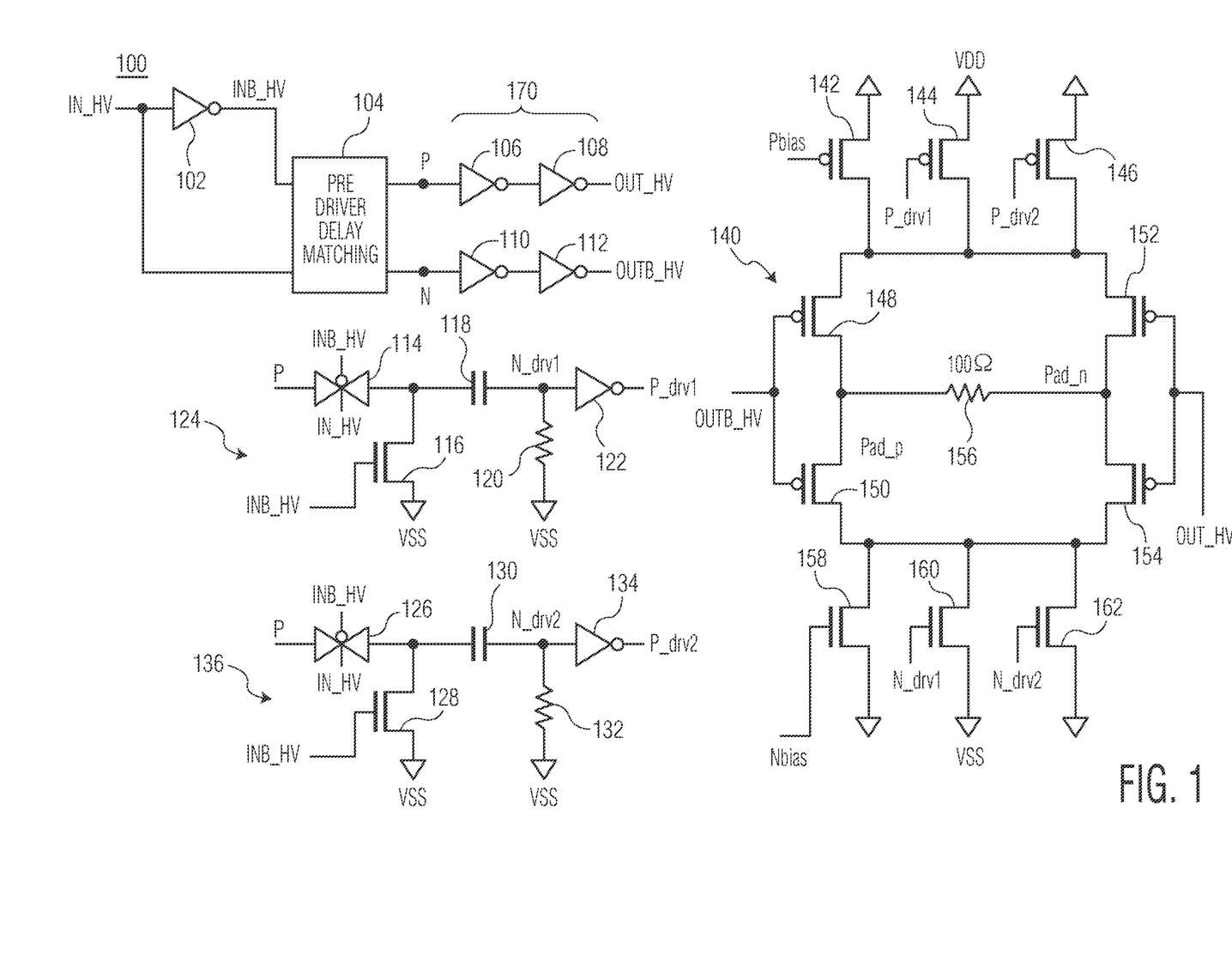
FIG. 1 illustrates, in partial block diagram and partial schematic form, a transmitter circuit in accordance with one embodiment of the present invention.

FIG. 1 illustrates an LVDS transmitter circuit 100. Transmitter circuit 100 receives a single ended input signal, IN_HV, and converts the single ended input signal to a complementary output signals, including complementary signals, OUT_HV and OUTB_HV.

These complementary signals are provided to a driver stage 140 of the transmitter 100, which outputs complementary pad signals Pad_N and Pad_P. The pad signals are provided to output pads (i.e. external terminals) and may be transmitted via a pair of transmission lines to a load in which the pair of transmission lines carry the complementary signals. In one example, the pair of transmission lines may be twisted wires or traces on a printed circuit board. Transmitter circuit 100 also includes an inverter 102, a pre-driver delay matching circuit 104, delay circuit 170, and pre-emphasis control circuits 124 and 136. Note that delay circuit 170 may be considered to be a part of pre-drive delay matching circuit 104.

Inverter 102 receives IN_HV and outputs INB_HV. The HV indicates a high voltage signal, in which, in one embodiment, IN_HV is a single ended digital data stream which includes a series of pulses varying between 0 and VDD. This may be seen on the bottom of the timing diagram of FIG. 2. IN_HV and INB_HV are provided as inputs to pre-driver delay matching circuit 104, which provides corresponding outputs P and N, respectively, in which P is a delayed version of IN_HV and N is a delayed version of INB_HV. P and N are complementary signals generated from IN_HV and INB_HV but are delay matched with each other. This may be performed by a series of inverters on each path, a known in the art. Node P and N may each be referred to as an intermediate node of transmitter 100, Note that the signal at node P is, for most of the time, complementary to INB_HV, and node N is, for most of the time, complementary to IN_HV. Node P is coupled to an input of inverter 106, which has an output coupled to an input of inverter 108, which provides OUT_HV. Node N is coupled to an input of inverter 110, which has an output coupled to an input of inverter 112, which provides OUTB_HV. Therefore, OUT_HV corresponds to a delayed version of the signal at node P and of IN_HV, and OUTS_HV corresponds to a delayed version of the signal node N and INB_HV, and both OUT_HV and OUTB_HV are delay matched to each other. This can also be seen at the top of the timing diagram of FIG. 2.

Driver stage 140 includes PMOS transistors 142, 144, 146, 148, and 152, and NMOS transistors 150, 154, 158, 160, and 162. Transistors 142, 144, and 146 each have a first current electrode coupled to a first voltage supply terminal (i.e. a first voltage supply rail) which is coupled to receive a first supply voltage, e.g. VDD. Therefore, note that the first voltage supply terminal may simply be referred to as VDD herein. Transistors 142, 144, and 146 each have a second current electrode coupled to both a first current electrode of transistors 148 and a first current electrode of transistors 152. A control electrode of transistor 142 is coupled to receive a bias current, Pbias. A control electrode of transistor 144 is coupled to receive a control signal, P_drv1, from pre-emphasis control circuit 124, and a control electrode of transistor 146 is coupled to receive a control signal, P_drv2, from pre-emphasis control circuit 136. A second current electrode of transistor 148 provides output, Pad_P, and a second current electrode of transistor 152 provides output, Pad_N. Outputs Pad_P and Pad_N are provided to external terminals of transmitter 100 (i.e. the external terminals or pads of the integrated circuit which contains transmitter 100). A resistor 156 is coupled between the second current electrodes of transistors 148 and 152, and in one embodiment, has a resistance of 100 Ohms.

Continuing with driver stage 140, a first current electrode of transistor 150 is coupled to the second current electrode of transistor 148, and a first current electrode of transistor 154 is coupled to the second current electrode of transistor 152. Control electrodes of transistors 148 and 150 are coupled to receive OUTB_HV, and control electrodes of transistors 152 and 154 are coupled to receive OUT_HV. Transistors 158, 160, and 162 each have a first current electrode coupled to both the second current electrode of transistor 150 and the second current electrode of transistor 154. Transistors 158, 160, and 162 each have a second current electrode coupled to a second voltage supply terminal (i.e. a second voltage supply rail) coupled to receive a second supply voltage, e.g. VSS, in which VDD is greater than VSS. Therefore, note that the second voltage supply terminal may simply be referred to as VSS herein. A control electrode of transistor 158 is coupled to receive a bias current, Nbias. A control electrode of transistor 160 is coupled to receive a control signal, N_drv1, from pre-emphasis control circuit 124, and a control electrode of transistor 162 is coupled to receive a control signal, N_drv2, from pre-emphasis control circuit 136.

Pre-emphasis control circuit 124 includes a transmission gate 114 (also referred to as a switch or pass gate), an NMOS transistor 116, a capacitive element 118 which provides a capacitance, a resistive element 120 which provides a resistance, and an inverter 122. A first data terminal of transmission gate 114 is coupled to node P, and a second terminal of transmission gate 114 is coupled to a first terminal of capacitive element 118. A non-inverting control input of transmission gate 114 is coupled to receive IN_HV, and an inverting control input of transmission gate 114 is coupled to receive INB_HV. When the non-inverting control input is at a logic level one and the inverting control input is at a logic level zero, the first and second data terminal of transmission gate 114 are connected to each other, otherwise, they are disconnected from each other such that node P is isolated from capacitive element 118. A first current electrode of transistor 116 is coupled to the second data terminal of transmission gate 114, a second current electrode of transistor 116 is coupled to VSS, and a control electrode of transistor 116 is coupled to receive INB_HV. A second terminal of capacitive element 118 provides control output N_drv1 to driver stage 140 and is coupled to a first terminal of resistive element 120. A second terminal of resistive element 120 is coupled to VSS. N_drv1 is coupled to an input of inverter 122, which provides control output P_drv1 to driver stage 140.

Pre-emphasis control circuit 136 includes a transmission gate 126 (also referred to as a switch or pass gate), an NMOS transistor 128, a capacitive element 130 which provides a capacitance, a resistive element 132 which provides a resistance, and an inverter 134. A first data terminal of transmission gate 126 is coupled to node N, and a second terminal of transmission gate 126 is coupled to a first terminal of capacitive element 130. A non-inverting control input of transmission gate 126 is coupled to receive INB_HV, and an inverting control input of transmission gate 126 is coupled to receive IN_HV. When the non-inverting control input is at a logic level one and the inverting control input is at a logic level zero, the first and second data terminal of transmission gate 126 are connected to each other, otherwise, they are disconnected from each other such that node N is isolated from capacitive element 130. A first current electrode of transistor 128 is coupled to the second data terminal of transmission gate 126, a second current electrode of transistor 128 is coupled to VSS, and a control electrode of transistor 128 is coupled to receive IN_HV. A second terminal of capacitive element 130 provides control output N_drv2 to driver stage 140 and is coupled to a first terminal of resistive element 132. A second terminal of resistive element 132 is coupled to VSS. N_drv2 is coupled to an input of inverter 134, which provides control output P_drv2 to driver stage 140.

In operation, transistors 142, 148, 152, 150, 154, and 158 operate as the main driver circuit of driver stage 140 which drives Pad_P and Pad_N to the appropriate complementary levels in response to OUTB_HV and OUT_HV, in which Pad_P is complementary to OUTB_HV and Pad_N is complementary to OUT_HV. During transitions of OUT_HV and OUTB_HV, though, portions of a pre-emphasis circuit of driver stage 140, including transistors 144, 146, 160, and 162, are activated to provide additional current boost to driver stage 140 for the transitions. The pre-emphasis circuit of driver stage 140 is activated by RC pulses from pre-emphasis circuits 124 and 136. For example, as will be described in more detail below, when the signal at node P (on which OUT_HV is based) transitions from a logic level zero to a logic level one (0 to 1), RC pulses are provided on P_drv1 to activate (i.e. turn on) transistor 144 and on N_drv1 to activate transistor 160. During this transition, transistors 144 and 160 provide additional current to boost driver stage 140. Upon completion of the RC pulses, transistors 144 and 160 again deactivate (turn off). Similarly, when the signal at node N (on which OUTB_HV) is based) transitions from a logic level zero to a logic level one (0 to 1), RC pulses are provided on P_drv2 to activate (i.e. turn on) transistor 146 and on N_drv2 to activate transistor 162. During this transition, transistors 146 and 162 provide additional current to boost driver stage 140. Upon completion of the RC pulses, transistors 146 and 162 again deactivate (turn off).

Pre-emphasis control circuit 124 includes an RC circuit formed by capacitive element 118 and resistive element 120, and provides RC pulses on N_drv1 and P_drv1 based on the RC time constant provided by its RC circuit. Similarly, pre-emphasis control circuit 136 includes an RC circuit formed by capacitive element 130 and resistive element 132, and provides RC pulses on N_drv2 and P_drv2 based on the RC time constant provided by its RC circuit. Operation of pre-emphasis circuits 124 and 136 will be described in more detail in reference to the timing diagram of FIG. 2.

Referring first to pre-emphasis control circuit 124, when the input data stream, IN_HV, transition from a 0 to a 1, transmission gate 114 turns on (i.e. is enabled or activated), connecting node P to the first terminal of capacitor 118. After the IN_HV transitions to a 1, the transition propagates through pre-driver delay matching circuit 104, and node P followed by OUT_HV transitions from a 0 to 1 as well.

Figure 2:
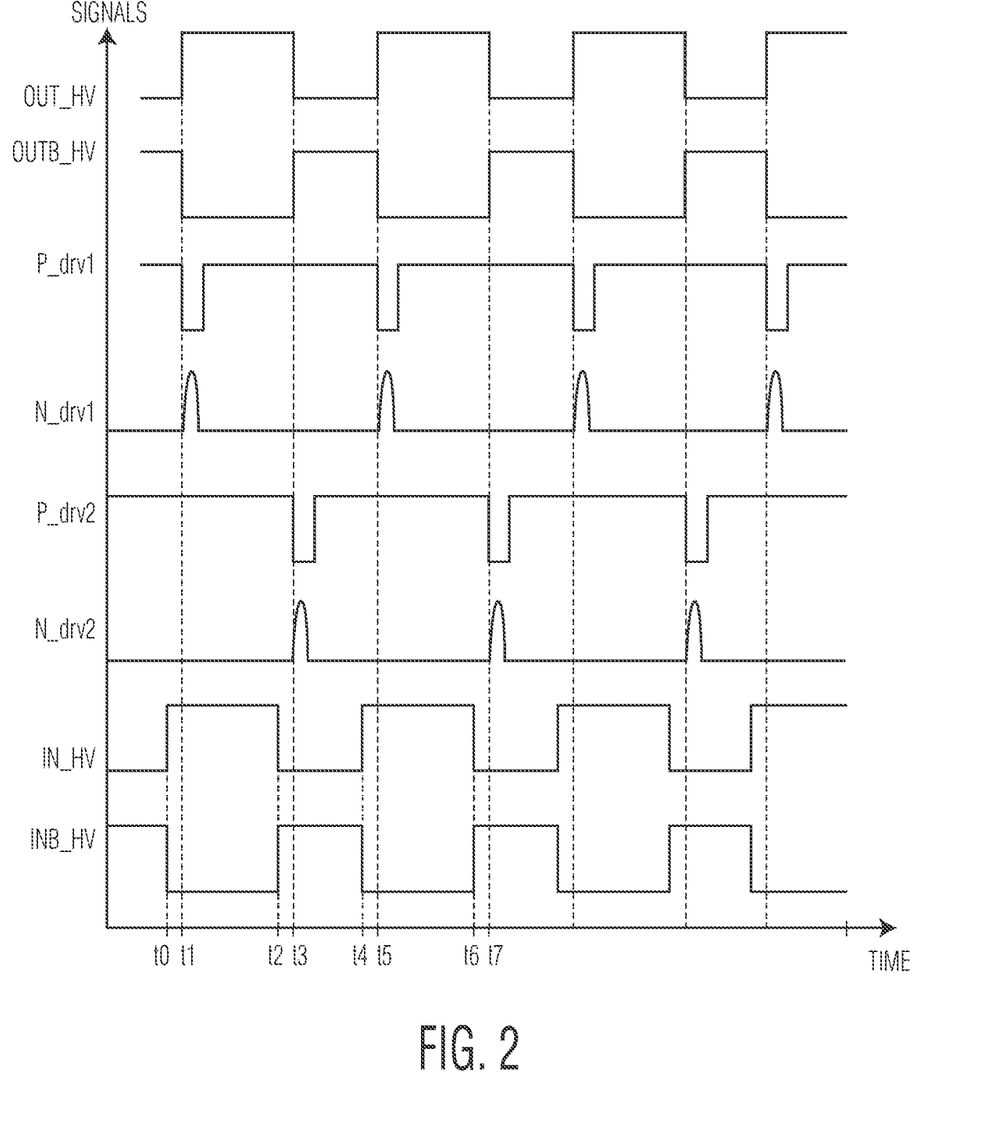
FIG. 2 illustrates a timing diagram of various signals in the circuit of FIG. 1, in accordance with one embodiment of the present invention.

Therefore, as seen in at the bottom line and top line of FIG. 2 respectively, IN_HV transitions from 0 to 1 at time t0 and OUT_HV transitions from 0 to 1 at time t1. At this time, with node P connected to capacitive element 118, capacitive element 118 charges up and N_drv1 goes to a logic high as well. Due to inverter 122, P_drv2 goes low. Therefore, upon a rising edge of OUT_HV, transmission gate 114 is enabled and pulses on N_drv1 and P_drv1 are initiated at time t1 (with N_drv1 being a positive pulse which turns on NMOS transistor 160 of driver stage 140 and P_drv1 being a negative pulse which turns on PMOS transistor 144 of driver stage 140). Due to the presence of the RC circuit, the duration of the pulses on N_drv1 and P_drv1 are determined by the discharge rate (RC time constant) of the RC circuit. Once the RC circuit discharges, N_drv1 returns to a 0 and P_drv1 returns to a 1, thus turning off transistors 160 and 144, respectively, of driver stage 140. Therefore, the pre-emphasis driver circuit of transistors 160 and 144 is only activated for the duration of the RC pulses on N_drv1 and P_drv1, respectively. However, for driver stage 140, the drive needs to be strengthened only upon transitions of IN_HV/OUT_HV from 0 to 1 and should be disabled before the next signal transition on IN_HV/OUT_HV from 1 to 0 (in which pre-emphasis control circuit 136 controls the boost in drive strength for the 1 to 0 transitions of IN_HV, as described below).

In pre-emphasis control circuit 124, when IN_HV is a 1, transmission gate 114 is turned on, but transistor 116 is off (due to INB_HV being a 0). Upon IN_HV transitioning to 0 (and INB_HV to a 1), transistor 116 turns on, which ensures that capacitive element 118 is fully discharged before the next rising edge of IN_HV, and transmission gate 114 turns off, isolating node P from capacitive element 118. Discharging of capacitive element 118 also ensures that capacitive element 118 starts charging from 0 at the next rising edge of IN_HV.

Pre-emphases control circuit 136 operates in a similar manner to pre-emphasis control circuit 124, but provides a boost during 1 to 0 transitions of IN_HV through the use of RC pulses on N_drv2 and P_drv2 to control transistors 162 and 146, respectively, of driver stage 140. When the input data stream, IN_HV, transition from a 1 to a 0, transmission gate 126 turns on (i.e. is enabled or activated), connecting node N to the first terminal of capacitor 130. After IN_HV transitions to a 0 (and INB_HV to a 1), the transition propagates through pre-driver delay matching circuit 104, and node N followed by OUTB_HV transitions from a 1 to 0 as well. Therefore, as seen in at the bottom line and top line of FIG. 2 respectively, IN_HV transitions from 1 to 0 at time t2 and OUT_HV transitions from 1 to 0 at time t3. At this time, with node N connected to capacitive element 130, capacitive element 130 charges up and N_drv2 goes to a logic high as well. Due to inverter 134, P_drv2 goes low. Therefore, upon a falling edge of OUT_HV, transmission gate 126 is enabled and pulses on N_drv2 and P_drv2 are initiated at time t3 (with N_drv2 being a positive pulse which turns on NMOS transistor 162 of driver stage 140 and P_drv2 being a negative pulse which turns on PMOS transistor 146 of driver stage 140). Due to the presence of the RC circuit, the duration of the pulses on N_drv2 and P_drv2 are determined by the discharge rate (RC time constant) of the RC circuit of pre-emphasis control circuit 136. Once the RC circuit discharges, N_drv2 returns to a 0 and P_drv2 returns to a 1, thus turning off transistors 162 and 146, respectively, of driver stage 140. Therefore, the pre-emphasis driver circuit of transistors 162 and 146 is only activated for the duration of the RC pulses on N_drv2 and P_drv2.

In pre-emphasis control circuit 136, when IN_HV is a 0, transmission gate 126 is turned on, but transistor 128 is off. Upon IN_HV transitioning to 1, transistor 128 turns on, which ensures that capacitive element 130 is fully discharged before the next falling edge of IN_HV, and transmission gate 126 turns off, isolating node N from capacitive element 130. Discharging of capacitor 130 also ensures that capacitive elements 130 starts charging from 0 at the next falling edge of IN_HV.

In the illustrated embodiment, N-drv1 and N_drv2 are provided at the second terminal of capacitive elements 118 and 130, respectively, therefore, the edges of the resulting RC pulses are not as sharp as compared to the more squared edges of P_drv1 and P_drv2 at the output of inverters 122 and 134, respectively. In alternate embodiments, in order to obtain sharper edges for the RC pulses on N_drv1 and N_drv2, an additional inverter may be chained at the output of each of inverters 122 and 134 in which the output of this additional inverter may be used to provide N_drv1 and N_drv2 to driver stage 140. Also, in general, additional delay elements may be added within pre-driver delay matching circuit 104 or within delay element 170, as needed, where signals at different intermediate nodes of the path containing node P or the path containing node N can be provided to pre-emphasis control circuit 124 and 136, respectively, to generate the RC pulses. Similarly, different signals along the delay paths can be used to control transmission gates 114 and 126, so long as the different signals ensure that the corresponding transmission gate is ON prior to generating the RC pulses.

Figure 3:
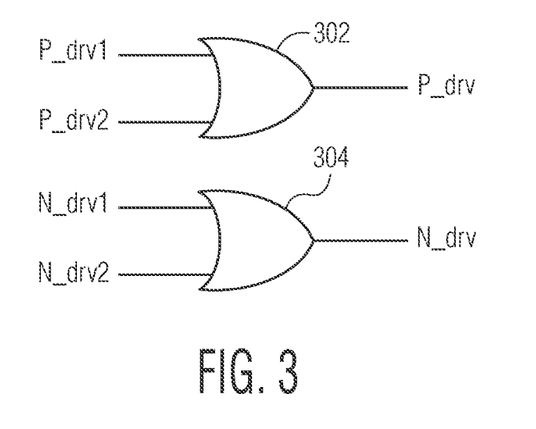
FIG. 3 illustrates, in schematic form, additional control circuitry for use in the circuit of FIG. 1, in accordance with one embodiment of the present invention.

FIG. 3 illustrates, in schematic form, additional control circuitry which may be included in the pre-emphasis control circuits 124 and 136. In one embodiment, driver stage 140 may include only one additional PMOS transistor for the pre-emphases drive circuit (as compared to having both PMOS transistors 144 and 146 which are alternately activated by P_drv1 and P_drv2) and only one additional NMOS transistor for the pre-emphasis driver circuit (as compared to having both NMOS transistors 160 and 162 which are alternately activated by N_drv1 and N_drv2). In this case, the single pre-emphasis PMOS transistor would receive P_drv at its control electrode and the single pre-emphasis NMOS transistor would receive N_drv at its control electrode. Referring to FIG. 3, P_drv is provided as an output of AND gate 302 and is a logic level 0 (as needed to activate or turn on a PMOS transistor) when either P_drv1 or P_drv2 is asserted by pre-emphasis control circuit 124 or pre-emphasis control circuit 136, respectively. N_drv is provided as an output of OR gate 304 and is a logic level 1 (as needed to activate or turn on an NMOS transistor) when either N_drv1 or N_drv2 is asserted by pre-emphasis control circuit 124 or pre-emphasis control circuit 136, respectively. In this manner, P_drv would provide a negative RC pulse on each rising or falling edge of the data stream (or of OUT_HV), and N_drv would similarly provide a positive RC pulse on each rising or falling edge of the data stream (or of OUT_HV). Therefore, OR gates 302 and 304 provide digital logic which combines RC pulses prior to being provided to the pre-emphasis driver circuits of driver stage 140. Note that, in alternate embodiments, other digital logic circuits may be used to provide different logic combinations of RC pulses on P_drv1, P_drv2, N_drv1, and N_drv2 to provide RC pulses as needed to one or more pre-emphasis drive transistors of driver stage 140.

Figure 4:
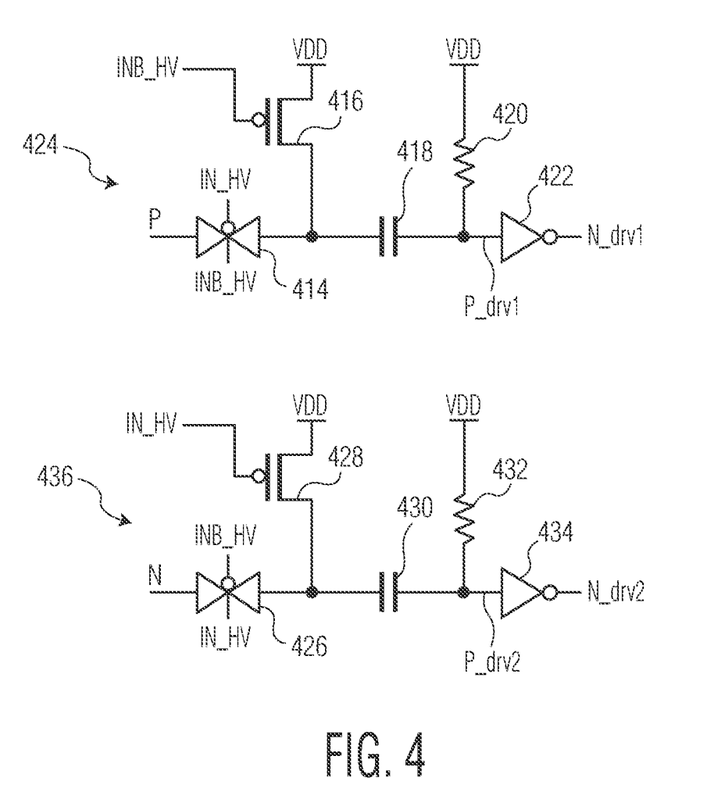
FIG. 4 illustrates, in schematic form, and alternate embodiment of control circuitry in the circuit of FIG. 1, in accordance with one embodiment of the present invention.

FIG. 4 illustrates pre-emphasis control circuits 424 and 436 which provide alternate embodiments of pre-emphasis control circuits 124 and 136. Pre-emphasis control circuit 424 includes a transmission gate 414 (also referred to as a switch or pass gate), a PMOS transistor 416, a capacitive element 418 which provides a capacitance, a resistive element 420 which provides a resistance, and an inverter 422. A first data terminal of transmission gate 414 is coupled to node P, and a second terminal of transmission gate 414 is coupled to a first terminal of capacitive element 418. A non-inverting control input of transmission gate 414 is coupled to receive INB_HV, and an inverting control input of transmission gate 414 is coupled to receive IN_HV. When the non-inverting control input is at a logic level one and the inverting control input is at a logic level zero, the first and second data terminal of transmission gate 414 are connected to each other, otherwise, they are disconnected from each other such that node P is isolated from capacitive element 418. A first current electrode of transistor 416 is coupled VDD, and a second current electrode of transistor 416 is coupled to the second data terminal of transmission gate 414, and a control electrode of transistor 416 is coupled to receive INB_HV. A second terminal of capacitive element 418 provides control output P_drv1 to driver stage 140 and is coupled to a first terminal of resistive element 420. A second terminal of resistive element 420 is coupled to VDD. P_drv1 is coupled to an input of inverter 422, which provides control output N_drv1 to driver stage 140.

Pre-emphasis control circuit 436 includes a transmission gate 426 (also referred to as a switch or pass gate), a PMOS transistor 428, a capacitive element 430 which provides a capacitance, a resistive element 432 which provides a resistance, and an inverter 434. A first data terminal of transmission gate 426 is coupled to node N, and a second terminal of transmission gate 426 is coupled to a first terminal of capacitive element 430. A non-inverting control input of transmission gate 426 is coupled to receive IN_HV, and an inverting control input of transmission gate 426 is coupled to receive INB_HV. When the non-inverting control input is at a logic level one and the inverting control input is at a logic level zero, the first and second data terminal of transmission gate 426 are connected to each other, otherwise, they are disconnected from each other such that node N is isolated from capacitive element 430. A first current electrode of transistor 428 is coupled to VDD, a second current electrode of transistor 428 is coupled to the second data terminal of transmission gate 426, and a control electrode of transistor 428 is coupled to receive IN_HV. A second terminal of capacitive element 430 provides control output P_drv2 to driver stage 140 and is coupled to a first terminal of resistive element 432. A second terminal of resistive element 432 is coupled to VDD. P_drv2 is coupled to an input of inverter 434, which provides control output N_drv2 to driver stage 140.

Pre-emphasis control circuit 424 operates analogously to pre-emphases control circuit to 124, but provides RC pulses N_drv1 and P_drv1 in response to falling edges of P (of IN_HV). For example, when P transitions from 1 to 0, transmission gate 414 turns on and capacitor 418 is charged, which initiates an RC pulse on P_drv1 and an RC pulse at the output of inverter 422 on N_drv1. These pulses are the same as illustrated in FIG. 2, but would start on falling edges of OUT_HV, such as at times t3 and t7. Also, when INB_HV goes back to 0, capacitive element 418 is fully discharged, prior to the next falling edge of OUT_HV.

Similarly, pre-emphasis control circuit 436 operates analogously to pre-emphasis control circuit to 436, but provides RC pulses N_drv2 and P_drv2 in response to rising edges of P or falling edges of N (of IN_HV). For example, when N transitions from 1 to 0 (INB_HV going from 1 to 0 or IN_HV going from 0 to 1), transmission gate 426 turns on and capacitor 430 is charged, which initiates an RC pulse on P_drv2 and an RC pulse at the output of inverter 434 on N_drv2. These pulses are the same as illustrated in FIG. 2, but would start on rising edges of OUT_HV, such as at times t1 and t5. Also, when INB_HV goes back to 1, capacitive element 430 is fully discharged, prior to the next falling edge of OUT_HV.

With the embodiments described above, note that the pre-emphasis driver circuit (including transistors 144, 146, 160, and 162) are controlled by the RC pulses generated by the pre-emphasis control circuits. The RC circuit of each of the control circuits provide the time duration of the RC pulses which control the pre-emphasis driver circuit. The use of an RC circuit to control timing of these pulses may allow for improved non-variability of the RC pulses across different PVT values, thus allowing improved control of the pre-emphasis drivers.

Therefore, by now it can be understood how pre-emphasis driver transistors can be used to strengthen a driver stage of a transmitter upon transitions of the input data stream. This results in reduced glitches on the die side pads which provides the complementary output signals. With reduced glitches, these complementary signals can be combined and looped back to circuitry on the die, such a BIST circuit, to properly test the resulting signals for proper functionality. In one embodiment, the pre-emphasis driver transistors are controlled by RC pulses generated by pre-emphasis control circuits based on signals along the paths of the complementary signals generated from the input data stream. These RC pulses are aligned with transitions of the complementary signals (e.g. OUT_HV and OUTB_HV) provided to the driver stage of the transmitter.

The terms "assert" or "set" and "negate" (or "deassert" or "clear") are used herein when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one.

Each signal described herein may be designed as positive or negative logic, where negative logic can be indicated by a bar over the signal name or a "B" following the name. In the case of a negative logic signal, the signal is active low where the logically true state corresponds to a logic level zero. In the case of a positive logic signal, the signal is active high where the logically true state corresponds to a logic level one. Note that any of the signals described herein can be designed as either negative or positive logic signals. Therefore, in alternate embodiments, those signals described as positive logic signals may be implemented as negative logic signals, and those signals described as negative logic signals may be implemented as positive logic signals.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Although the invention has been described with respect to specific conductivity types or polarity of potentials, skilled artisans appreciated that conductivity types and polarities of potentials may be reversed.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Those skilled in the art will recognize that the boundaries between logic blocks are merely illustrative and that alternative embodiments may merge logic blocks or circuit elements or impose an alternate decomposition of functionality upon various logic blocks or circuit elements. Thus, it is to be understood that the architectures depicted herein are merely exemplary, and that in fact many other architectures can be implemented which achieve the same functionality.

Also for example, in one embodiment, the illustrated elements of transmitter 100 are circuitry located on a single integrated circuit or within a same device. Furthermore, those skilled in the art will recognize that boundaries between the functionality of the above described operations merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

Although the invention is described herein with reference to specific embodiments, various modifications and changes can be made without departing from the scope of the present invention as set forth in the claims below. For example, the main driver portion of transmitter 100 may include additional elements or different elements as needed, in which the pre-emphasis driver portion may provide additional current boosts when needed at transitions of the signals through the use of the RC pulses described above. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

The following are various embodiments of the present invention.

In one embodiment, a circuit includes a transmitter circuit including a single-to-complementary circuit that generates complementary output signals from a single ended input signal; a driver stage in which the driver stage includes inputs to receive the complementary output signals, the driver stage includes a main driver circuit and a pre-emphasis driver circuit, and the pre-emphasis driver circuit is active during transitions of the complementary output signals to provide additional current for the driver stage; and a pre-emphasis control circuit which includes an RC pulse generation circuit in which the RC pulse generation circuit includes a capacitance and a resistance, and the RC pulse generation circuit provides based on edges of a signal, pulses having a duration based on an RC time constant of the capacitance and resistance, wherein the pre-emphasis driver circuit is active to provide additional current for the driver stage in response to the pulses. In one aspect of this embodiment, a beginning edge of each of the pulses is aligned with a transition of the complementary output signals. In another aspect, the pre-emphasis control circuit includes a second RC pulse generation circuit, the second RC pulse generation circuit includes a second capacitance and a second resistance, the second RC pulse generation circuit provides based on edges of a second signal, pulses having a duration based on an RC time constant of the second capacitance and the second resistance of the second RC pulse generation circuit, wherein the pre-emphasis driver circuit is active to provide additional current for the driver stage in response to the pulses of the second RC circuit. In a further aspect, the pre-emphasis driver circuit includes a first set of drivers and a second set of drivers, the first set is responsive to pulses of the RC pulse generation circuit, and the second set is responsive to pulses of the second RC pulse generation circuit. In yet a further aspect, a first driver of the first set and a second driver of the second set couple a first node of the driver stage to a first power supply rail when active; and a third driver of the first set and a fourth driver of the second set couple a second node of the driver stage to a second power supply rail when active. In another aspect of the above embodiment, the RC pulse generation circuit triggers on a signal from an intermediate signal node of the single-to-complementary circuit. In a further aspect, one of the complementary output signals is a delayed version of the signal from the intermediate signal node. In another further aspect, the RC pulse generation circuit includes a switch for coupling the signal from the intermediate signal node with the capacitance, wherein the switch is controlled by a second signal from a second signal node of the single to complementary circuit. In yet a further aspect, the signal from the intermediate signal node is a delayed version of the second signal. In another yet further aspect, the switch is a pass gate, the pass gate including a first control input to receives the second signal and a second control input to receive a third signal that is complementary to the second signal. In another aspect, the circuit further includes logic for combining the pulses of the RC pulse generation circuit and the pulses of the second RC pulse generation circuit prior to being provided to the pre-emphasis driver circuit. In another aspect, the RC pulse generation circuit includes a switch for resetting a voltage of the capacitance to a voltage of a power supply rail when closed in response to a second signal. In a further aspect, the second signal is generated by a signal node of the single-to-complementary circuit. In another further aspect, the signal and the second signal are for the majority of the time complementary in value. In yet another aspect of the above embodiment, the RC pulse generation circuit produces pulse at a first node, wherein the capacitance and the resistance are connected to the first node. In another aspect, the output stage includes a first output node and a second output node for providing complementary output signals, the first output node is connected a first external terminal of an integrated circuit that includes the transmitter circuit and the second output node is connected to a second external terminal of the integrated circuit. In a further aspect, the circuit further includes a test circuit, including a first input and a second input, the first input connected to the first output node and the second input connected to the second output node to convert the differential outputs into a single ended signal for test of the circuit functionality. In another aspect, a beginning edge of each of the pulses is triggered by a rising or a falling transition of the signal.

In another embodiment, a circuit includes a transmitter circuit including a single-to-complementary circuit that generates complementary output signals from a single ended input signal; a driver stage, the driver stage including inputs to receive the complementary output signals, the driver stage including a main driver circuit, a pair of output nodes for providing complementary output signals, and a pre-emphasis driver circuit, the pre-emphasis driver circuit is active during transitions of the complementary output signals to provide addition current for the driver stage; and a pre-emphasis control circuit. In this another embodiment, the pre-emphasis control circuit includes a first RC pulse generation circuit, the first RC pulse generation circuit including a first capacitance and a first resistance, the first RC pulse generation circuit provides based on edges of a signal, pulses having a duration based on an RC time constant of the first capacitance and first resistance, and a second RC pulse generation circuit, the second RC pulse generation circuit including a second capacitance and a second resistance, the second RC pulse generation circuit provides based on edges of a second signal, pulses having a duration based on an RC time constant of the second capacitance and the second resistance of the second RC pulse generation circuit, wherein the pre-emphasis driver circuit is active to provide additional current for the driver stage in response to the pulses from the first RC pulse generation circuit and the pulses from the second RC pulse generation circuit. In one aspect of the another embodiment, the first signal and the second signal are complementary signals from the single-to-complementary circuit, the complementary output signals are delayed versions of the first and second signals.

What is claimed is:

1. A circuit comprising:
  a transmitter circuit including:
    a single-to-complementary circuit that generates complementary output signals from a single ended input signal;
    a driver stage, the driver stage including inputs to receive the complementary output signals, the driver stage including a main driver circuit and a pre-emphasis driver circuit, the pre-emphasis driver circuit is active during transitions of the complementary output signals to provide additional current for the driver stage;
    a pre-emphasis control circuit including an RC pulse generation circuit, the RC pulse generation circuit including a capacitance and a resistance, the RC pulse generation circuit provides based on edges of a signal, pulses having a duration based on an RC time constant of the capacitance and resistance, wherein the pre-emphasis driver circuit is active to provide additional current for the driver stage in response to the pulses,
    wherein a beginning edge of each of the pulses is aligned with a transition of the complementary output signals.

2. A circuit comprising:
  a transmitter circuit including:
    a single-to-complementary circuit that generates complementary output signals from a single ended input signal;
    a driver stage, the driver stage including inputs to receive the complementary output signals, the driver stage including a main driver circuit and a pre-emphasis driver circuit, the pre-emphasis driver circuit is active during transitions of the complementary output signals to provide additional current for the driver stage;
    a pre-emphasis control circuit including an RC pulse generation circuit, the RC pulse generation circuit including a capacitance and a resistance, the RC pulse generation circuit provides based on edges of a signal, pulses having a duration based on an RC time constant of the capacitance and resistance, wherein the pre-emphasis driver circuit is active to provide additional current for the driver stage in response to the pulses,
    wherein the pre-emphasis control circuit includes a second RC pulse generation circuit, the second RC pulse generation circuit including a second capacitance and a second resistance, the second RC pulse generation circuit provides based on edges of a second signal, pulses having a duration based on an RC time constant of the second capacitance and the second resistance of the second RC pulse generation circuit, wherein the pre-emphasis driver circuit is active to provide additional current for the driver stage in response to the pulses of the second RC circuit.

3. The circuit of claim 2 wherein the pre-emphasis driver circuit includes a first set of drivers and a second set of drivers, the first set is responsive to pulses of the RC pulse generation circuit, and the second set is responsive to pulses of the second RC pulse generation circuit.

4. The circuit of claim 3 wherein:
  a first driver of the first set and a second driver of the second set couple a first node of the driver stage to a first power supply rail when active;
  a third driver of the first set and a fourth driver of the second set couple a second node of the driver stage to a second power supply rail when active.

5. The circuit of claim 2 further comprising logic for combining the pulses of the RC pulse generation circuit and the pulses of the second RC pulse generation circuit prior to being provided to the pre-emphasis driver circuit.

6. A circuit comprising:
  a transmitter circuit including:
    a single-to-complementary circuit that generates complementary output signals from a single ended input signal;
    a driver stage, the driver stage including inputs to receive the complementary output signals, the driver stage including a main driver circuit and a pre-emphasis driver circuit, the pre-emphasis driver circuit is active during transitions of the complementary output signals to provide additional current for the driver stage;
    a pre-emphasis control circuit including an RC pulse generation circuit, the RC pulse generation circuit including a capacitance and a resistance, the RC pulse generation circuit provides based on edges of a signal, pulses having a duration based on an RC time constant of the capacitance and resistance, wherein the pre-emphasis driver circuit is active to provide additional current for the driver stage in response to the pulses, wherein the RC pulse generation circuit triggers on a signal from an intermediate signal node of the single-to-complementary circuit.

7. The circuit of claim 6 wherein one of the complementary output signals is a delayed version of the signal from the intermediate signal node.

8. The circuit of claim 6 wherein the RC pulse generation circuit includes a switch for coupling the signal from the intermediate signal node with the capacitance, wherein the switch is controlled by a second signal from a second signal node of the single to complementary circuit.

9. The circuit of claim 8 wherein the signal from the intermediate signal node is a delayed version of the second signal.

10. The circuit of claim 8 wherein the switch is a pass gate, the pass gate including a first control input to receives the second signal and a second control input to receive a third signal that is complementary to the second signal.

11. A circuit comprising:
a transmitter circuit including:
a single-to-complementary circuit that generates complementary output signals from a single ended input signal;
a driver stage, the driver stage including inputs to receive the complementary output signals, the driver stage including a main driver circuit and a pre-emphasis driver circuit, the pre-emphasis driver circuit is active during transitions of the complementary output signals to provide additional current for the driver stage;
a pre-emphasis control circuit including an RC pulse generation circuit, the RC pulse generation circuit including a capacitance and a resistance, the RC pulse generation circuit provides based on edges of a signal, pulses having a duration based on an RC time constant of the capacitance and resistance, wherein the pre-emphasis driver circuit is active to provide additional current for the driver stage in response to the pulses,
wherein the RC pulse generation circuit includes a switch for resetting a voltage of the capacitance to a voltage of a power supply rail when closed in response to a second signal.

12. The circuit of claim 11 wherein the second signal is generated by a signal node of the single-to-complementary circuit.

13. The circuit of claim 11 wherein the signal and the second signal are for the majority of the time complementary in value.

14. A circuit comprising:
a transmitter circuit including:
a single-to-complementary circuit that generates complementary output signals from a single ended input signal;
a driver stage, the driver stage including inputs to receive the complementary output signals, the driver stage including a main driver circuit and a pre-emphasis driver circuit, the pre-emphasis driver circuit is active during transitions of the complementary output signals to provide additional current for the driver stage;
a pre-emphasis control circuit including an RC pulse generation circuit, the RC pulse generation circuit including a capacitance and a resistance, the RC pulse generation circuit provides based on edges of a signal, pulses having a duration based on an RC time constant of the capacitance and resistance, wherein the pre-emphasis driver circuit is active to provide additional current for the driver stage in response to the pulses,
wherein the RC pulse generation circuit produces pulse at a first node, wherein the capacitance and the resistance are connected to the first node.

15. The circuit of claim 14 further comprising:
a test circuit, including a first input and a second input, the first input connected to the first output node and the second input connected to the second output node to convert the differential outputs into a single ended signal for test of the circuit functionality.

16. A circuit comprising:
a transmitter circuit including:
a single-to-complementary circuit that generates complementary output signals from a single ended input signal;
a driver stage, the driver stage including inputs to receive the complementary output signals, the driver stage including a main driver circuit and a pre-emphasis driver circuit, the pre-emphasis driver circuit is active during transitions of the complementary output signals to provide additional current for the driver stage;
a pre-emphasis control circuit including an RC pulse generation circuit, the RC pulse generation circuit including a capacitance and a resistance, the RC pulse generation circuit provides based on edges of a signal, pulses having a duration based on an RC time constant of the capacitance and resistance, wherein the pre-emphasis driver circuit is active to provide additional current for the driver stage in response to the pulses,
wherein the output stage includes a first output node and a second output node for providing complementary output signals, the first output node is connected a first external terminal of an integrated circuit that includes the transmitter circuit and the second output node is connected to a second external terminal of the integrated circuit.

17. A circuit comprising:
a transmitter circuit including:
a single-to-complementary circuit that generates complementary output signals from a single ended input signal;
a driver stage, the driver stage including inputs to receive the complementary output signals, the driver stage including a main driver circuit and a pre-emphasis driver circuit, the pre-emphasis driver circuit is active during transitions of the complementary output signals to provide additional current for the driver stage;
a pre-emphasis control circuit including an RC pulse generation circuit, the RC pulse generation circuit including a capacitance and a resistance, the RC pulse generation circuit provides based on edges of a signal, pulses having a duration based on an RC time constant of the capacitance and resistance, wherein the pre-emphasis driver circuit is active to provide additional current for the driver stage in response to the pulses, wherein a beginning edge of each of the pulses is triggered by a rising or a falling transition of the signal.

18. A circuit comprising:
a transmitter circuit including:
  a single-to-complementary circuit that generates complementary output signals from a single ended input signal;
  a driver stage, the driver stage including inputs to receive the complementary output signals, the driver stage including a main driver circuit, a pair of output nodes for providing complementary output signals, and a pre-emphasis driver circuit, the pre-emphasis driver circuit is active during transitions of the complementary output signals to provide addition current for the driver stage;
  a pre-emphasis control circuit including:
    a first RC pulse generation circuit, the first RC pulse generation circuit including a first capacitance and a first resistance, the first RC pulse generation circuit provides based on edges of a signal, pulses having a duration based on an RC time constant of the first capacitance and first resistance,
    a second RC pulse generation circuit, the second RC pulse generation circuit including a second capacitance and a second resistance, the second RC pulse generation circuit provides based on edges of a second signal, pulses having a duration based on an RC time constant of the second capacitance and the second resistance of the second RC pulse generation circuit;
  wherein the pre-emphasis driver circuit is active to provide additional current for the driver stage in response to the pulses from the first RC pulse generation circuit and the pulses from the second RC pulse generation circuit.

19. The circuit of claim 18 wherein the first signal and the second signal are complementary signals from the single-to-complementary circuit, the complementary output signals are delayed versions of the first and second signals.

* * * * *